(12) United States Patent
Jung et al.

(10) Patent No.: US 12,325,053 B2
(45) Date of Patent: Jun. 10, 2025

(54) SUBSTRATE TREATING APPARATUS AND SUBSTRATE TREATING METHOD

(71) Applicant: SEMES CO., LTD., Cheonan-si (KR)

(72) Inventors: Jin Woo Jung, Cheonan-si (KR); Do Hyeon Yoon, Cheonan-si (KR); Young Hun Lee, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 598 days.

(21) Appl. No.: 17/702,127

(22) Filed: Mar. 23, 2022

(65) Prior Publication Data

US 2022/0305530 A1 Sep. 29, 2022

(30) Foreign Application Priority Data

Mar. 25, 2021 (KR) .................. 10-2021-0038599

(51) Int. Cl.
*H01L 21/67* (2006.01)
*B08B 3/02* (2006.01)
(Continued)

(52) U.S. Cl.
CPC .............. *B08B 3/08* (2013.01); *B08B 3/022* (2013.01); *B08B 3/041* (2013.01); *B08B 13/00* (2013.01); *H01L 21/67034* (2013.01)

(58) Field of Classification Search
CPC ......... H01L 21/67028; H01L 21/67034; H01L 21/6704; H01L 21/67051; H01L 21/67253; H01L 21/67259; H01L 21/67276
See application file for complete search history.

(56) References Cited

U.S. PATENT DOCUMENTS

2012/0006356 A1\* 1/2012 Kamikawa ........ H01L 21/67051
134/10
2019/0164787 A1 5/2019 Lee et al.
(Continued)

FOREIGN PATENT DOCUMENTS

JP 2007-012837 A 1/2007
JP 2019-121781 A 7/2019
(Continued)

OTHER PUBLICATIONS

Office Action dated Dec. 19, 2022, issued in corresponding Taiwan Patent Application No. 11121246940.

*Primary Examiner* — David G Cormier
(74) *Attorney, Agent, or Firm* — Harness, Dickey & Pierce, P.L.C.

(57) ABSTRACT

The inventive concept provides a substrate treating method. The substrate treating method comprising: a liquid treating step for cleaning a substrate by supplying a treating liquid to the substrate in a first process chamber; a transfer step for transferring the substrate to a second process chamber after the liquid treating step; and a drying step for removing the treating liquid remaining on the substrate in the second process chamber, and wherein the method further comprises a standby step of a liquid treated substrate to standby in the first process chamber when the liquid treated substrate of the liquid treating step cannot be transferred to the second process chamber, and at the standby step the treating liquid is discharged until the substrate can be transferred to the second process chamber.

11 Claims, 8 Drawing Sheets

(51) Int. Cl.
  *B08B 3/04*     (2006.01)
  *B08B 3/08*     (2006.01)
  *B08B 13/00*    (2006.01)

(56) References Cited

U.S. PATENT DOCUMENTS

2020/0135503 A1  4/2020  Sasaki
2020/0227285 A1  7/2020  Iwao et al.

FOREIGN PATENT DOCUMENTS

| JP | 2020-004757 A | 1/2020 |
| KR | 10-2009-0036019 A | 4/2009 |
| KR | 10-2019-0064372 A | 6/2019 |
| KR | 10-2020-0000814 A | 1/2020 |
| KR | 102135941 B1 | 7/2020 |
| TW | 202034477 A | 9/2020 |

* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2021-0038599 filed on May 25, 2021, in the Korean Intellectual Property Office, the entire contents of which are hereby incorporated by reference.

BACKGROUND

Embodiments of the inventive concept described herein relate to a substrate treating apparatus and a substrate treating method.

Conventionally, integrated circuit devices such as semiconductor devices may be manufactured by repeatedly performing a series of unit processes on a substrate, e.g., a semiconductor substrate. For example, electrical circuit patterns constituting integrated circuit devices may be formed on the substrate by performing unit processes such as a deposition process, a photolithography process, an etching process, a cleaning process, a drying process, etc.

For the etching process or the cleaning process among the unit processes, the substrate is treated through a plurality of processes such as a chemical treating process of supplying an etching liquid or a cleaning liquid onto a rotating substrate, a rinsing process of supplying a rinsing liquid, and a drying treating process of supplying a drying gas.

Recently, as semiconductors are becoming fine size, it is needed to prevent fine patterns from collapsing, an anti-drying liquid is applied onto a substrate (wetting) after a chemical treatment is performed in a cleaning chamber, and then the substrate is transferred to a drying chamber for a drying treatment.

On the other hand, when a situation occurs in which it is impossible to transfer the substrate to the drying chamber due to issues such as the drying chamber having a problem while the anti-drying liquid is applied on the substrate, the substrate cannot be transferred to the drying chamber and the substrate stands by while having been applied with the anti-drying liquid.

In this case, as a standby time elapses, there is a problem in that the anti-drying liquid applied on the substrate evaporates and a pattern on the substrate is gradually exposed. In addition, a pattern of an exposed region of the substrate collapses over time. In addition, as the standby time increases, substrates with all surfaces exposed are discarded without performing an additional process to reduce cost, so a throughput is significantly lowered.

SUMMARY

Embodiments of the inventive concept provide a substrate treating apparatus and a substrate treating method capable of preventing a collapse of a pattern.

An object of the inventive concept is not limited thereto, and other objects not mentioned may be clearly understood by those skilled in the art from the following description.

The inventive concept provides a substrate treating method. The substrate treating method includes a liquid treating step for cleaning a substrate by supplying a treating liquid to the substrate in a first process chamber; a transfer step for transferring the substrate to a second process chamber after the liquid treating step; and a drying step for removing the treating liquid remaining on the substrate in the second process chamber, and wherein the method further comprises a standby step of a liquid treated substrate to standby in the first process chamber when the liquid treated substrate of the liquid treating step cannot be transferred to the second process chamber, and at the standby step the treating liquid is discharged until the substrate can be transferred to the second process chamber.

In an embodiment, the treating liquid comprises an anti-drying liquid.

In an embodiment, the standby step comprises: a determination step for determining the anti-drying liquid; and a supply step for resupplying the determined anti-drying liquid to the substrate at standby in the first process chamber.

In an embodiment, the supply step comprises: predicting a time point at which the second process chamber becomes available for receiving the substate; and completing a supplying of the anti-drying liquid according to the predicted time point.

In an embodiment, the supply step comprises: a first supply step for supplying the anti-drying liquid to the substrate in standby; a second supply step for stopping a supplying of the anti-drying liquid after a predetermined time, and supplying a deionized water DIW to the substrate until the substrate can be transferred to the second process chamber; and a third supply step for resupplying the anti-drying liquid after the second supply step.

In an embodiment, the method predicts a time point at which the second process chamber becomes available for receiving the substrate, and at the second supply step the supplying of the deionized water DIW is stopped earlier than the predicted time point to complete a resupplying of the anti-dry liquid according to the predicted time point.

In an embodiment, the anti-drying liquid includes an isopropyl alcohol IPA.

In an embodiment, the drying step uses a supercritical fluid to eliminate the treating liquid remaining on the substrate.

In an embodiment, the liquid treating step treats the substrate by supplying a first liquid, a second liquid, and a third liquid sequentially to the substrate, the treating liquid is the third liquid, a supercritical fluid is used to dry the substrate at the drying step, and the third liquid is a liquid that dissolves better in the supercritical fluid than the second liquid.

The inventive concept provides an apparatus for treating a substrate. The substrate treating apparatus comprising: a liquid treating chamber for liquid treating a substrate by supplying a treating liquid on the substrate; a drying chamber for removing the treating liquid from the substrate; a transfer unit for transferring the substrate between the liquid treating chamber and the drying chamber; and a controller for controlling the liquid treating chamber, the drying chamber, and the transfer unit, wherein the controller controls the liquid treated substrate to standby at the liquid treating chamber until the drying chamber becomes available for receiving the substrate from the liquid treating chamber, when the liquid treated substrate at the liquid treating chamber cannot be transferred to the drying chamber, and the controller controls the treating liquid to be supplied to the substrate while the liquid treated substrate is standing by.

In an embodiment, the treating liquid comprises an anti-drying liquid, and the controller determines a state of the anti-drying liquid remaining on the substrate, and when it is determined that the state of the anti-drying liquid is out of an allowable range, the anti-drying liquid is supplied to the substrate in standby at the liquid treating chamber.

In an embodiment, the controller predicts a time point at which the drying chamber becomes available for receiving the substrate from the liquid treating chamber, and the controller controls a supplying of the anti-drying liquid to be completed at the predicted time point.

In an embodiment, the controller controls the supplying of the anti-drying liquid to be stopped and controls a deionized water DIW to be supplied to the substrate, when a predetermined time elapses from a time when the anti-drying liquid starts to be supplied to the substrate while the substrate is standing by, and the controller controls a supplying of the deionized water DIW to be stopped and controls the anti-dry liquid to be resupplied to the substrate, when the drying chamber becomes available for receiving the substrate.

In an embodiment, the controller predicts a time point at which the drying chamber becomes available for receiving the substrate, and the controller controls a stop time of the supplying of the deionized water DIW and controls a resupply time of the anti-drying liquid, so that the supplying of the anti-dry liquid is completed at the predicted time point.

In an embodiment, the anti-dry liquid includes an isopropyl alcohol IPA.

In an embodiment, the liquid treating chamber comprises: a cup formed inside a treating space; a support unit for supporting and rotating the substate in the treating space; and a liquid supply unit for supplying a treating liquid to the substrate, wherein the liquid supply unit includes a first nozzle supplying a first liquid to the substrate, a second nozzle supplying a second liquid to the substrate, and a third nozzle supplying a third liquid to the substrate, and the treating liquid is the third liquid.

In an embodiment, the drying chamber comprises: a body having an inner space formed therein; a support for supporting the substrate in the inner space; a fluid supply unit for supplying a supercritical fluid to the inner space; and an exhaust unit for exhausting the supercritical fluid within the inner space.

In an embodiment, the third liquid dissolves better in the supercritical fluid than the second liquid.

In an embodiment, the first liquid includes a chemical, the second liquid includes a deionized water DIW, and the third liquid includes an anti-drying liquid.

The inventive concept provides an apparatus for treating a substrate. The substrate treating apparatus comprising: a liquid treating chamber for liquid treating a substrate by supplying a treating liquid on the substrate; a drying chamber for removing the treating liquid from the substrate; a transfer unit for transferring the substrate between the liquid treating chamber and the drying chamber; and a controller for controlling the liquid treating chamber, the drying chamber, and the transfer unit, wherein the liquid treating chamber comprises: a cup formed inside a treating space; a support unit supporting and rotating a substate in the treating space; and a liquid supply unit supplying a treating liquid to the substrate, and wherein the liquid supply unit includes a first nozzle supplying a chemical to the substrate, a second nozzle supplying a deionized water DIW to the substrate, and a third nozzle supplying an anti-drying liquid to the substrate, and the treating liquid includes the anti-drying liquid, and the drying chamber comprises: a body having an inner space formed therein; a support for supporting the substrate in the inner space; a fluid supply unit supplying a supercritical fluid to the inner space; and an exhaust unit for exhausting the supercritical fluid within the inner space, and wherein the controller controls the anti-drying liquid to be supplied to the substrate until the drying chamber becomes available for receiving the substrate from the liquid treating chamber, when a treated substrate at the liquid treating chamber cannot be transferred to the drying chamber.

According to an embodiment of the inventive concept, a substrate treating apparatus and a substrate treating method capable of preventing a collapse of a pattern when a substrate cannot be transferred to a drying chamber while an anti-drying liquid is applied on the substrate after a completion of a chemical treatment may be provided.

According to an embodiment of the inventive concept, a substrate treating apparatus and a substrate treating method capable of maximizing a wafer throughput (UPEH) per hour may be provided.

The technical objectives of the inventive concept are not limited to the above-mentioned ones, and the other unmentioned technical objects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
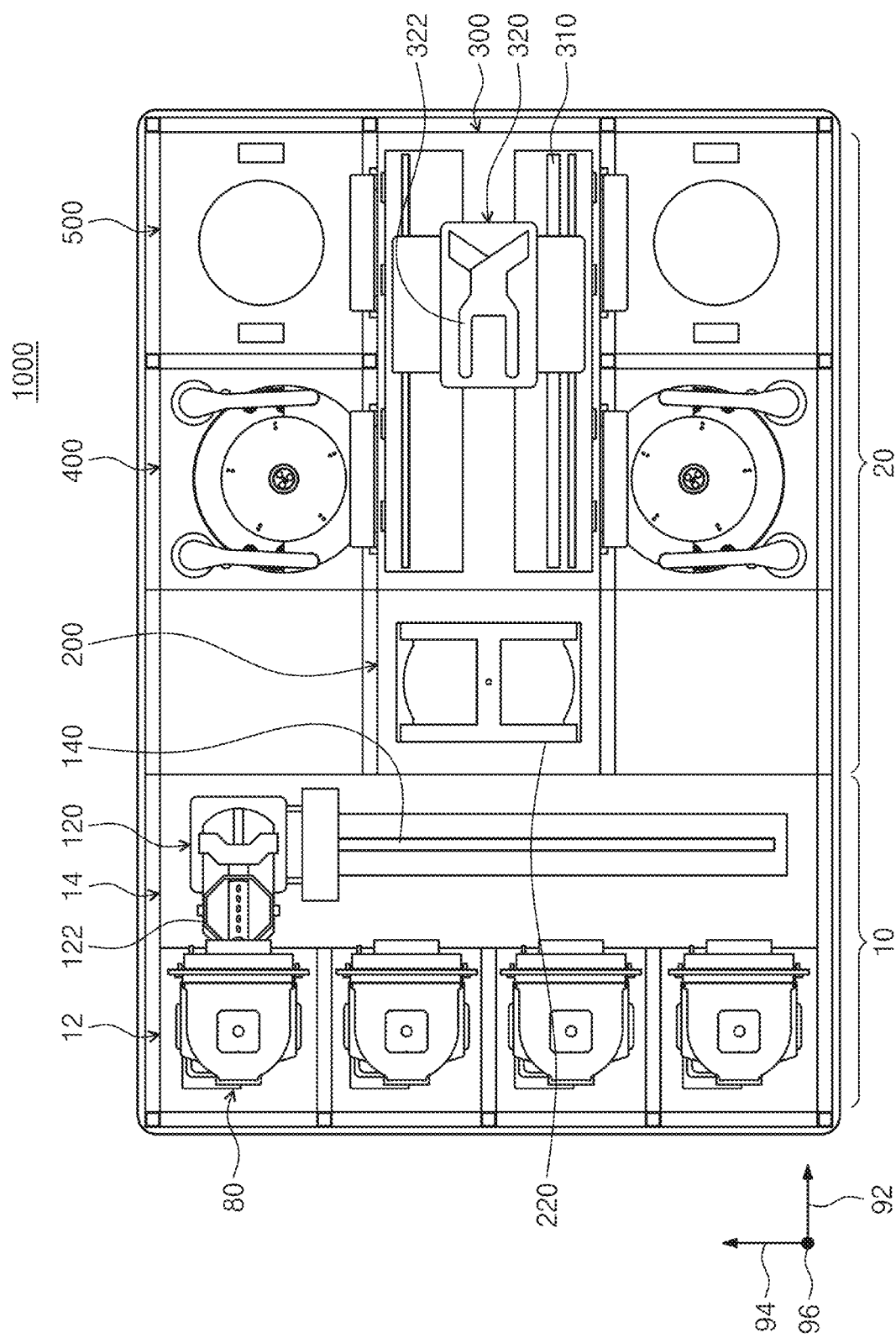
FIG. 1 is a plan view schematically illustrating a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or"

includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

A controller may control an overall operation of a substrate treating apparatus. The controller may include a central processing unit (CPU), a read only memory (ROM), and a random access memory (RAM). The CPU executes a desired treatment such as a liquid treatment and a drying treatment to be described later according to various recipes stored in these storage areas. A recipe may contain a process time, a process pressure, a process temperature, and various gas flow rates, which are a control information of the apparatus regarding process conditions. Meanwhile, these programs or recipes representing process conditions may be stored in a hard disk or a semiconductor memory. In addition, the recipe may be set at a predetermined location in the storage area while being stored in a storage medium such as a CD-ROM or DVD that is readable by a transportable computer.

Hereinafter, a substrate treating apparatus according to the inventive concept will be described.

The substrate treatment apparatus may perform a cleaning step of cleaning a substrate using a cleaning liquid, and a supercritical drying step of drying the substrate using a supercritical fluid as a process fluid. Here, the substrate is a comprehensive concept including any substrate which is used for manufacturing a semiconductor device, a flat panel display (FPD), and any other circuits having fine circuit patterns. Examples of such a substrate W include a silicon wafer, a glass substrate, an organic substrate, and the like.

FIG. 1 is a schematic plan view illustrating a substrate treating apparatus according to an embodiment of the inventive concept.

Referring to FIG. 1, the substrate treating apparatus 1000 may include an index unit 10 and a processing unit 20. According to an embodiment, the index unit 10 and the processing unit 20 may be disposed in a direction. Hereinafter, the direction in which the index unit 10 and the processing unit 20 are disposed is referred to as a first direction 92, a direction perpendicular to the first direction 92 when seen from above is referred to as a second direction 94, and a direction perpendicular to both the first direction 92 and the second direction 94 is referred to as a third direction 96.

The index unit 10 transfers a substrate W to the processing unit 20 from a container 80 in which the substrate W is stored, and stores the substrate W in which the processing unit 20 has completed a treatment at the container 80. A lengthwise direction of the index unit 10 is provided in the second direction 94. The index unit 10 may include a load port 12 and an index frame 14. The load port 12 and the processing unit 20 are located at opposite sides of the index frame 14. The container 80 in which the substrate W is stored is placed on the load port 12. A plurality of load ports 12 may be provided, and the plurality of load ports 12 may be disposed along the second direction 94.

A sealed container such as a front open unified pod (FOUP) may be used as the container 80. The container 80 may be placed on the load port 12 by means of transport (not illustrated) such as an overhead transfer, an overhead conveyor, or an automatic guided vehicle or an operator.

An index robot 120 may be provided in the index frame 14. A guide rail 140 with its lengthwise direction disposed in the second direction 94 may be provided in the index frame 14, and the index robot 120 may be provided to be movable along the guide rail 140. The index robot 120 may include a hand 122 on which the substrate W is placed, and the hand 122 may be provided to be forwardly and backwardly movable, rotatable with the third direction 96 as an axis, and movable along the third direction 96. A plurality of hands 122 are provided to be spaced apart in an up/down direction, and the hands 122 may be forwardly and backwardly movable independently from each other.

The processing unit 20 may include a buffer chamber 200, a transfer unit 300, a first process chamber 400, and a second process chamber 500.

The buffer chamber 200 provides a space in which a substrate W which will be transferred between the index unit 10 and the processing unit 20 temporarily stays. A buffer slot 220 may be provided in the buffer chamber 200. The substrate W may be placed on the buffer slot 220. For example, the index robot 120 may withdraw the substrate W from the container 80 and place the substrate W on the buffer slot 220. A substrate transfer robot 320 of the transfer unit 300 may withdraw the substrate W placed on the buffer slot 220 and transfer the substrate W to the first process chamber 400 or the second process chamber 500. A plurality of buffer slots 220 may be provided in the buffer chamber 200 to place a plurality of substrates W thereon.

The transfer unit 300 transfers the substrate W between the buffer chamber 200, the first process chamber 400, and the second process chamber 500 disposed around the transfer unit 300. The transfer unit 300 may include a substrate transfer robot 320 and a transfer rail 310. The substrate transfer robot 320 may move along the transfer rail 310 and may transfer the substrate W.

The first process chamber 400 and the second process chamber 500 may perform a cleaning process using a process fluid. The cleaning process may be sequentially performed in the first process chamber 400 and the second process chamber 500. For example, a liquid treating process may be performed in the first process chamber 300, and a drying process using a supercritical or an isopropyl alcohol IPA may be performed in the second process chamber 500.

The first process chamber 400 and the second process chamber 500 may be disposed at a side of the transfer unit 300. For example, the first process chamber 400 and the second process chamber 500 may be disposed to face each other at a different side of the transfer unit 300. In an embodiment, the first process chamber 400 may be disposed on a first side of the transfer unit 300, and the second process chamber 500 may be disposed on a second side of the transfer unit 300 opposite to the first side. A plurality of first process chambers 400 and a plurality of second process chambers 500 may be provided. The plurality of process chambers 400 and 500 may be arranged in a row at a side of the transfer unit 300. In an embodiment, some of the plurality of the first process chambers 400 may be disposed on the first side of the transfer unit 300, and the rest of the plurality of the first process chambers 400 may be disposed on the second side of the transfer unit 300. In addition, some of the plurality of the second process chambers 500 may be disposed on the first side of the transfer unit 300, and the rest of the plurality of the second process chambers 500 may be disposed on the second side of the transfer unit 300.

An arrangement of the first process chamber 400 and the second process chamber 500 is not limited to the above-described example, and may be changed in consideration of a footprint or a process efficiency of the substrate treating apparatus 10. The substrate treating apparatus 1000 may be controlled by the controller (not shown).

A lengthwise direction of the transfer unit 300 may be provided in the first direction 92. The transfer chamber 300 has the substrate transfer robot 320. The transfer rail 310 with its lengthwise direction disposed in the first direction 92 is provided in the transfer chamber 300, and the substrate transfer robot 320 may be provided to be movable along the transfer rail 340.

The substrate transfer robot 320 may include hands 322 on which the substrate W is placed, and the hands 322 may be provided to be forwardly and backwardly movable, rotatable with the third direction 96 as an axis, and movable along the third direction 96. The hands 322 are provided to be spaced apart in the up/down direction, and the hands 322 may be forwardly and backwardly movable independently from each other.

Figure 2:
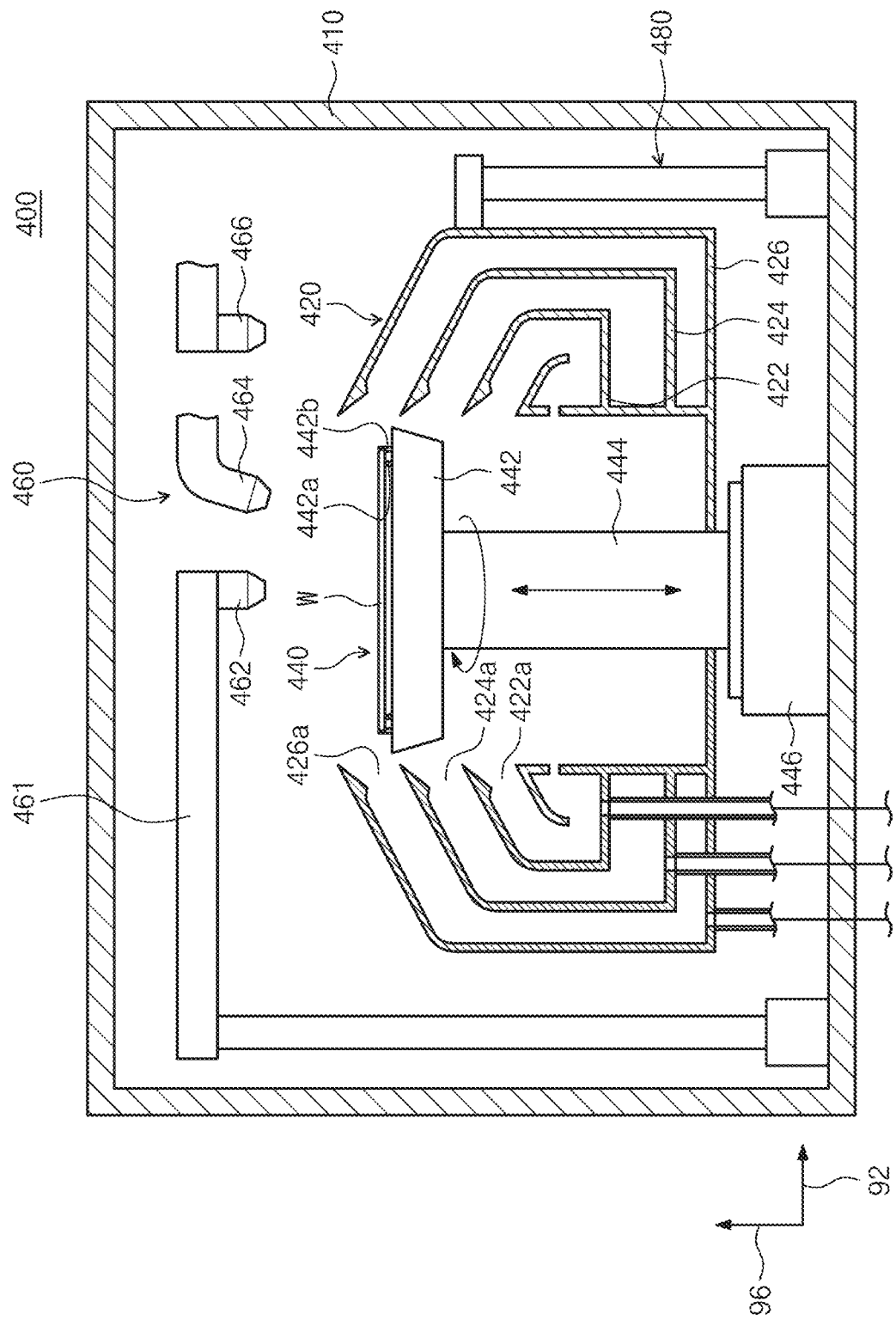
FIG. 2 is a view schematically illustrating an embodiment of a first process chamber of FIG. 1.

FIG. 2 is a view schematically illustrating an embodiment of the first process chamber of FIG. 1.

Referring to FIG. 2, the first process chamber 400 may include a housing 410, a cup 420, a support unit 440, a liquid supply unit 460, and a lifting/lowering unit 480. The first process chamber 400 may be referred to as a liquid treating chamber 400.

The housing 410 may be generally provided in a rectangular parallelepiped shape. The cup 420, the support unit 440, and the liquid supply unit 460 may be disposed in the housing 410.

The cup 420 has a treating space with an open top, and the substrate W is liquid-treated in the treating space. The support unit 440 supports the substrate W in the treating space. The liquid supply unit 460 supplies a liquid onto the substrate W supported by the support unit 440. The liquid may be provided in a plurality of types, and may be sequentially supplied onto the substrate W. The lifting/lowering unit 480 adjusts a relative height between the cup 420 and the support unit 440.

According to an embodiment, the cup 420 may include a plurality of recollecting containers 422, 424, and 426. Each of the recollecting containers 422, 424, and 426 has a recollecting space for recollecting respective liquid used for a substrate treatment. Each of the recollecting containers 422, 424, and 426 is provided in a ring shape surrounding the support unit 440. During the liquid treatment process, a pretreating liquid scattered by a rotation of the substrate W is introduced into a recollecting space through inlets 422a, 424a, and 426a of each recollecting container 422, 424, and 426. According to an embodiment, the cup 420 has a first recollecting container 422, a second recollecting container 424, and a third recollecting container 426. The first recollecting container 422 is disposed to surround the support unit 440, the second recollecting container 424 is disposed to surround the first recollecting container 422, and the third recollecting container 426 is disposed to surround the second recollecting container 424. The second inlet 424a introducing a liquid into the second recollecting container 424 may be located above the first inlet 422a introducing a liquid into the first recollecting container 422, and the third inlet 426a introducing a liquid into the third recollecting container 424a may be located above the second inlet 424a.

The support unit 440 has a support plate 442 and a drive shaft 444. A top surface of the support plate 442 is provided in a substantially circular shape and may have a diameter larger than that of the substrate W. A support pin 442a is provided at a central part of the support plate 442 to support a bottom surface of the substrate W, and a top end of the support pin 442a is provided to protrude from the support plate 442 such that the substrate W is spaced apart from the support plate 442 by a predetermined distance. A chuck pin 442b is provided at an edge of the support plate 442. The chuck pin 442b is provided to upwardly protrude from the support plate 442, and supports a side of the substrate W so that the substrate W is not separated from the support unit 440 when the substrate W is rotated. The drive shaft 444 is driven by the driver 446, is connected to a center of the bottom surface of the substrate W, and rotates the support plate 442 based on its central axis.

According to an embodiment, the liquid supply unit 460 may include a first nozzle 462, a second nozzle 464, and a third nozzle 466. The first nozzle 462 may supply a first liquid onto the substrate W. The first liquid may be a liquid for removing a film or a foreign material remaining on the substrate W. The second nozzle 464 may supply a second liquid onto the substrate W. The second liquid may be a liquid that is well soluble in a third liquid. For example, the second liquid may be a liquid that is better soluble in the third liquid than the first liquid. The second liquid may be a liquid that neutralizes the first liquid supplied onto the substrate W. In addition, the second liquid may be a liquid that neutralizes the first liquid and dissolves better in the third liquid than the first liquid at the same time. According to an embodiment, the second liquid may be a deionized water DIW. The third nozzle 466 may supply the third liquid onto the substrate W. The third liquid may be a liquid that is well soluble in the supercritical fluid used in the second process chamber 500. According to an embodiment, the third liquid (wetting liquid) may be a volatile organic solvent, a deionized water, or a mixture of a surfactant and a deionized water. The organic solvent may be an isopropyl alcohol IPA. According to an embodiment, the supercritical fluid may be a carbon dioxide. The substrate W is taken out of the first process chamber 400 in a state of being applied with the third liquid (wetted state) and brought into the second process chamber 500.

The first nozzle 462, the second nozzle 464, and the third nozzle 466 may be supported by different arms 461. The arms 461 may be moved independently. Optionally, the first nozzle 462, the second nozzle 464, and the third nozzle 466 may be mounted on a same arm 461 and moved simultaneously.

The lifting/lowering unit 480 moves the cup 420 in the up/down direction. A relative height between the cup 420 and the substrate W is changed by an up/down movement of the cup 420. As a result, the recollecting containers 422, 424, and 426 for recollecting the pretreating liquid are changed depending on a type of liquid supplied to the substrate W, so that the liquids can be separately recollected. Unlike the above description, the cup 420 is fixedly installed, and the lifting/lowering unit 480 may move the support unit 440 in the up/down direction.

Figure 3:
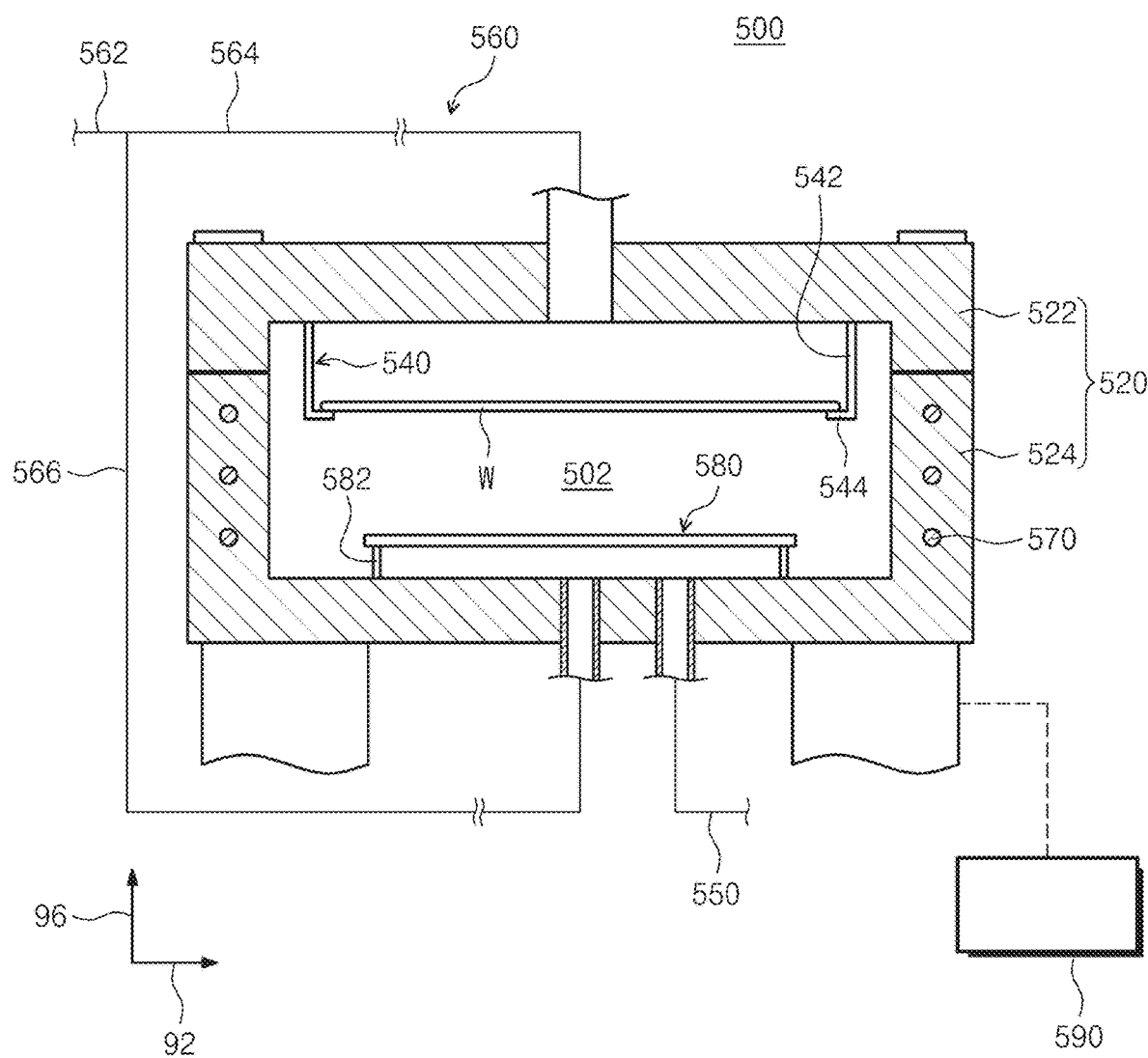
FIG. 3 is a view schematically illustrating an embodiment of a second process chamber of FIG. 1.

FIG. 3 is a view schematically illustrating an embodiment of the second process chamber of FIG. 1.

According to an embodiment, the second process chamber 500 removes the liquid on the substrate W using the supercritical fluid. The second process chamber 500 includes a body 520, a support 540, a fluid supply unit 560, and a blocking plate 580. The second process chamber 500 may be referred to as a drying chamber 500.

The body 520 provides an inner space 502 in which the drying process is performed. The body 520 has a top body 522 and a bottom body 524, and the top body 522 and the bottom body 524 are combined with each other to provide the above-described inner space 502. The top body 522 is provided at a top portion of the bottom body 524. A position of the top body 522 may be fixed, and the bottom body 524 may be lifted/lowered by a driving member 590 such as a cylinder. When the bottom body 524 is spaced apart from the top body 522, the inner space 502 is opened, and at this time, the substrate W is brought in or taken out. During the process, the bottom body 524 is in close contact with the top body 522, so that the inner space 502 is sealed from the outside. The second process chamber 500 has a heater 570. According to an embodiment, the heater 570 is located inside a wall of the body 520. The heater 570 heats the inner space 502 of the body 520 so that the fluid supplied into the inner space of the body 520 maintains a supercritical state.

The support 540 supports the substrate W in the inner space 502 of the body 520. The support 540 has a fixing rod 542 and a holder 544. The fixing rod 542 is fixedly installed on the top body 522 to downwardly protrude from a bottom surface of the top body 522. The fixing rod 542 is provided with its lengthwise direction in the up/down direction. A plurality of fixing rods 542 are provided and are spaced apart from each other. The fixing rods 542 are disposed so that the substrate W does not interfere with the fixing rods 542 when the substrate W is brought into or taken out of the space surrounded by them. The holder 544 is coupled to each of the fixing rods 542. The holder 544 extends from a lower end of the fixing rod 542 toward a space surrounded by the fixing rods 542. Due to the above-described structure, an edge region of a substrate W brought into the inner space 502 of the body 520 is placed on the holder 544, and an entire top surface region of the substrate W, a center region of the bottom surface of the substrate W, and a part of the edge region of the bottom surface of the substrate W are exposed to the drying fluid supplied to the inner space 502.

The fluid supply unit 560 supplies the drying fluid to the inner space 502 of the body 520. According to an embodiment, the drying fluid may be supplied to the inner space 502 in the supercritical state. In contrast, the drying fluid may be supplied to the inner space 502 in a gas state, and may be phase-changed to the supercritical state in the inner space 502. According to an embodiment, the fluid supply unit 560 has a main supply line 562, a top branch line 564, and a bottom branch line 566. The top branch line 564 and the bottom branch line 566 branch from the main supply line 562. The top branch line 564 is coupled to the top body 522 to supply the drying fluid toward a top surface (top side) of the substrate W placed on the support 540. According to an embodiment, the top branch line 564 is coupled to a center of the top body 522. The bottom branch line 566 is coupled to the bottom body 524 to supply the drying fluid toward a bottom surface (back side) of the substrate W placed on the support 540. According to an embodiment, the bottom branch line 566 is coupled to the center of the bottom body 524. An exhaust line 550 is coupled to the bottom body 524. The supercritical fluid in the inner space 502 of the body 520 is exhausted to the outside of the body 520 through the exhaust line 550.

The blocking plate 580 may be disposed in the inner space 502 of the body 520. The blocking plate 580 may be provided in a disk shape. The blocking plate 580 is supported by the support 582 to be upwardly spaced apart from the bottom surface of the body 520. A plurality of supports 582 are provided in a rod shape, and are disposed so as to be spaced apart from each other by a predetermined distance. When viewed from above, the blocking plate 580 may be provided to overlap an outlet of the bottom branch line 566 and an inlet of the exhaust line 550. The blocking plate 580 may prevent the substrate W from being damaged by directly discharging the drying fluid supplied through the bottom branch line 566 toward the substrate W.

Figure 4:
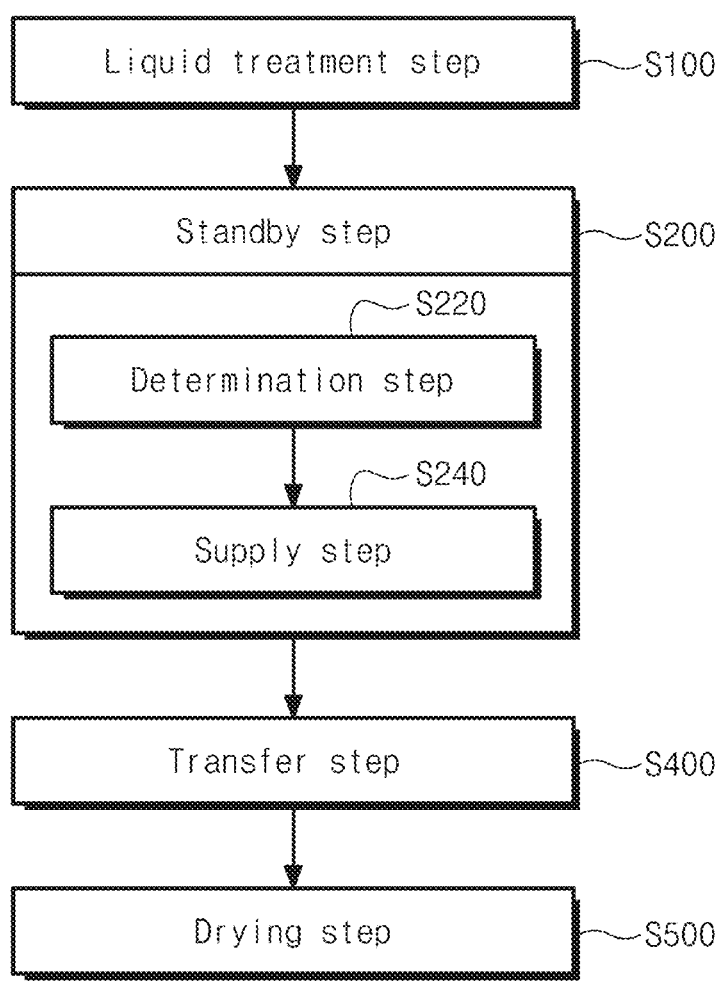
FIG. 4 is a flowchart schematically illustrating a substrate treating method according to an embodiment of the inventive concept.

FIG. 4 is a flowchart schematically illustrating a substrate treating method according to an embodiment of the inventive concept.

A liquid treatment step S100 may be performed in the first process chamber 400. In the liquid treatment step S100, a liquid is supplied onto the substrate W to liquid-treat the substrate W. According to an embodiment, in the liquid treatment step S100, a first liquid, a second liquid, and a third liquid are sequentially supplied to the substrate W to treat the substrate W. The first liquid may include a chemical including an acid or an alkali such as a sulfuric acid, a nitric acid, a hydrochloric acid, etc. The second liquid may contain a deionized water DIW. The third liquid may include an isopropyl alcohol IPA. Initially, a chemical is supplied to the substrate W to remove a thin film or a foreign material remaining on the substrate W. Thereafter, the deionized water is supplied onto the substrate W to replace the chemical with the deionized water on the substrate W. Thereafter, an isopropyl alcohol is supplied onto the substrate W to replace the deionized water with the isopropyl alcohol on the substrate W. The deionized water is better dissolved in the isopropyl alcohol than the chemical, so it can be easily replaced. In addition, the surface of the substrate W may be neutralized by the deionized water. Since the isopropyl alcohol is well soluble in a carbon dioxide used in the second process chamber 500, it can be easily removed by the carbon dioxide in the second process chamber 500.

The substrate treating method according to an embodiment of the inventive concept may include a transfer step S400. The transfer step S400 may be performed by the substrate transfer robot 320. When the liquid treatment is completed in the first process chamber 400, a transfer step S400 of transferring the substrate W from the first process chamber 400 to the second process chamber 500 may be performed. While the substrate W is transferred by the substrate transport robot 320, a liquid may remain on the substrate W. Hereinafter, the liquid remaining on the substrate W while being transferred by the substrate transport robot 320 is referred to as a treating liquid. For example, in the above-described example, the treating liquid may be the third liquid. Alternatively, in the above-described example, the treating liquid may be an isopropyl alcohol.

The substrate treatment method according to an embodiment of the inventive concept may include a drying step S500. The drying step S500 may be performed in the second process chamber 500. The substrate W brought into the second process chamber 500 is supported by the support 540 while an edge region thereof is placed on the holder 544. Initially, a carbon dioxide is supplied to the inner space 502 of the body 520 through the bottom branch line 566. When the inner space 502 of the body 520 reaches a set pressure, a carbon dioxide is supplied to the inner space 502 of the body 520 through the top branch line 564. Optionally, when the inner space 502 of the body 520 reaches the set pressure, the carbon dioxide may be simultaneously supplied to the inner space 502 of the body 520 through the top branch line 564 and the bottom branch line 566. During the process, a supply of the carbon dioxide to the inner space 502 of the body 520 and a discharge of the carbon dioxide from the inner space 502 may be periodically performed multiple times. By this method, when the treating liquid remaining on the substrate W is dissolved in a predetermined amount of a carbon dioxide in a supercritical state, the carbon dioxide is emitted from the inner space 502 and a new carbon dioxide is supplied to the inner space 502, hence improving a removal rate of the treating liquid from the substrate W.

The substrate treating method according to an embodiment of the inventive concept may further include a standby step S200.

The standby step S200 may be a step of standing by a substrate W having completed the liquid treatment in the first process chamber 400 until the second process chamber 500 becomes available for receiving the substrate W having completed the liquid treatment, in a case that the substrate cannot be transferred to the second process chamber 500 after the liquid treatment step S100 is completed. The standby step S200 may be performed in the first process chamber 400. However, the inventive concept is not limited thereto, and the standby step S200 may be performed in a separate chamber for standby.

The standby step S200 may be performed between the liquid treatment step S100 and the transfer step S400. For example, after the liquid treatment step S100 is completed in the first process chamber 400, the standby step S200 may be performed in a case that a substrate W having been applied with an anti-dry liquid cannot be transferred to the second process chamber 500. In this case, the situation in which the substrate W cannot be transferred to the second process chamber 500 may mean any situation in which the drying process cannot be performed due to a problem arising in the second process chamber 500 or in which all second process chambers 500 included in the facility are currently performing the drying process. However, this invention is not limited thereto, and in addition to the above-described examples, the standby step S200 can be performed in all situations in which the substrate W having been applied with the anti-dry liquid cannot be transferred, such as when the second process chamber 500 cannot receive the substrate having completed the liquid treatment, when the transfer unit 300 cannot transfer the substrate from the first process chamber 400 to the second process chamber 500, and when a situation has arisen in the first process chamber 400 where a transfer of the wafer is not possible. In addition, when there is a second process chamber 500 available for receiving the substrate when the liquid treatment step S100 is completed, the standby step S200 may be omitted.

The standby step S200 may include a determination step S220. In the determination step S220, when a substrate W wetted with the anti-drying liquid cannot be moved to the second process chamber 500, a state of the anti-drying liquid applied on a standby substrate W is determined. For example, the state of the anti-drying liquid may be whether the anti-drying liquid is remaining on the substrate or an amount of the anti-drying liquid.

The standby step S200 may include a supply step S240. In the supply step S240, a nozzle for discharging the anti-drying liquid re-enters the first process chamber 400 when a state of the anti-drying liquid is determined to be out of an allowable range in the determination step S200. For example, when the amount of the anti-drying liquid on the substrate is less than a set amount, it can be determined that it is out of an allowable range. The anti-drying liquid is supplied to the standby substrate W by the re-entered nozzle 466. In the supply step S240, the anti-drying liquid may be discharged until the standby substrate W is available for transferring to the second process chamber 500. In addition, in the supply step S240, a time point at which the second process chamber 500 becomes available for receiving the substrate may be predicted. In the supply step S240, a supply time of the anti-drying liquid, a discharge amount of the anti-drying liquid, and a rotation speed of the substrate W may be adjusted to complete a supplying of the anti-drying liquid at the predicted time point at which the second process chamber 500 becomes available. In this case, since a supplying of the anti-drying liquid is stopped at the time point at which the second process chamber 500 becomes available for receiving the substrate, the process time may be shortened, and a unit per equipment hour (UPEH) may be increased.

For a substrate W on which the supply step S240 is completed, a transfer step S400 is performed, at which the substrate W is transferred to the second process chamber 500 by the transfer unit 300.

Figure 5:
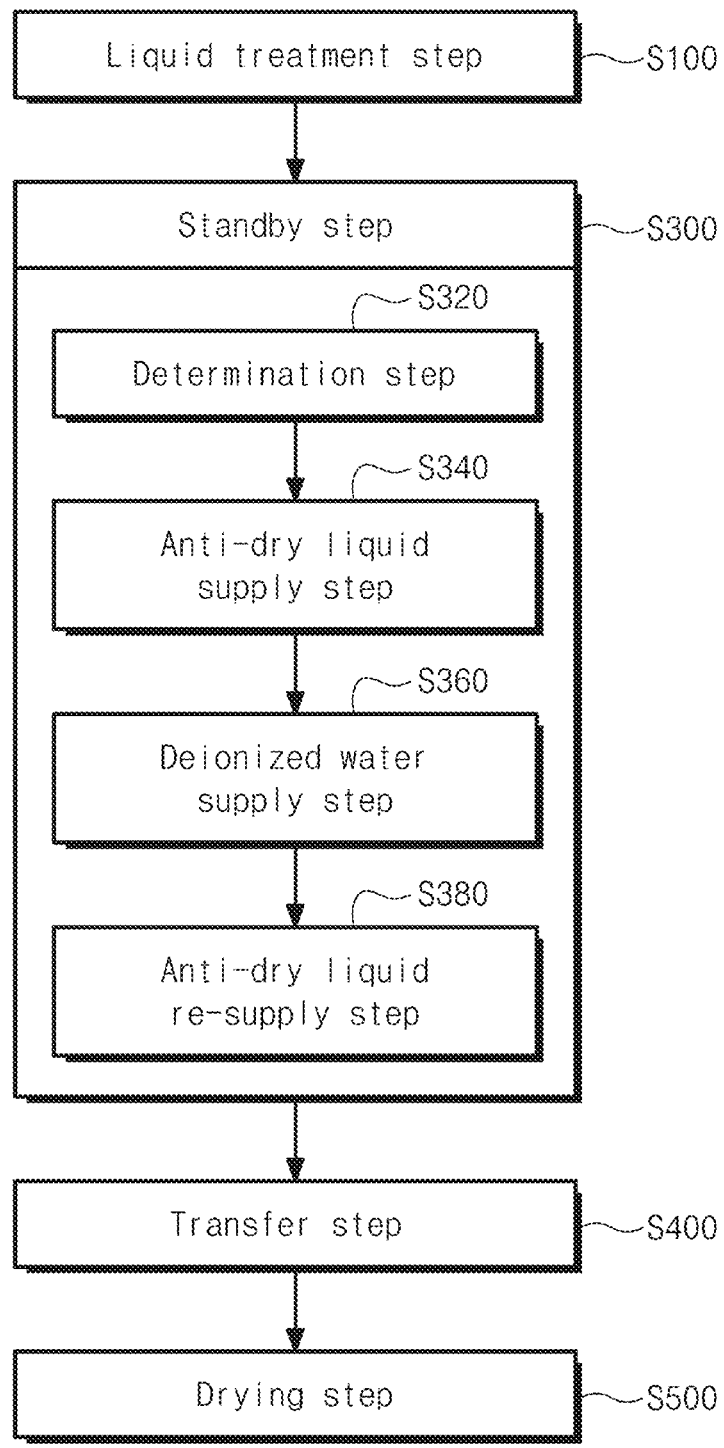
FIG. 5 is a flowchart schematically illustrating a substrate treating method according to another embodiment of the inventive concept.

FIG. 5 is a flowchart schematically illustrating a substrate treating method according to another embodiment of the inventive concept.

The substrate treating method according to another embodiment of the inventive concept may further include a standby step S300. The standby step S300 according to another embodiment may be the same as the standby step S200 according to the embodiment except for the supply step. Hereinafter, repeated descriptions will be omitted and differences will be mainly described.

The standby step S300 may include a determination step S320. In the determination step S320, when a substrate W wetted with the anti-drying liquid cannot be not moved to the second process chamber 500, a state of the anti-drying liquid applied on a standby substrate W is determined.

The standby step S200 may include a supply step. The supply step may be performed when it is determined that the state of the anti-drying liquid is out of an allowable range.

The supply step may include a first supply step S340. In the first supply step S340, the anti-drying liquid may be supplied to the standby substrate W. The first supply step S340 may be referred to as an anti-dry liquid supply step S340.

The supply step may include a second supply step S360. In the second supply step S360, a supplying of the anti-dry liquid may be stopped after a predetermined time elapses. In this case, the predetermined time may be 4 minutes to 6 minutes, and preferably, 5 minutes. However, the inventive concept is not limited thereto, and may be set differently according to a process recipe or a setting. In the second supply step S360, when the supplying of the anti-dry liquid is stopped, a deionized water DIW may be supplied to the substrate W until the substrate W is available for transferring to the second process chamber 500. Accordingly, it is possible to reduce an amount of the anti-drying liquid used. The second supply step S360 may be referred to as a deionized water supply step S360.

The supply step may include a third supply step S380. In the third supply step S380, the anti-drying liquid may be resupplied to the substrate W after the second supply step S360. In the third supply step S380, a discharge amount of the anti-drying liquid, a supply time of the anti-drying liquid, a rotation number of the substrate W, etc. may be set so that the anti-drying liquid is discharged onto the substrate W according to the process recipe. After the third supply step S380 is stopped, the substrate W may be subjected to a transfer step S400 of the substrate W being transferred to the second process chamber 500 by the transfer unit 300. The third supply step S380 may be referred to as an anti-dry liquid re-supply step S380.

In the above, it has been described that the deionized water is supplied until the second process chamber 500 becomes available for receiving the substrate, and the anti-drying liquid is resupplied when the second process chamber 500 becomes available for receiving the substrate. However, in another embodiment, in order to shorten the process time and increase the hourly substrate throughput (UPEH), a supplying of deionized water may be stopped and a resupplying of the anti-dry liquid may be performed based on the predicted time point at which the second process chamber 500 becomes available for receiving the substrate. In more detail, in the second supply step S360, the supply of deionized water DIW may be stopped in advance and earlier than the predicted time point so that the re-supplying of the anti-dry liquid is completed at the predicted time point. In the third supply step S380, when the supply of deionized water DIW is stopped, the anti-drying liquid may be resupplied to the substrate W. In this case, a stop time of the re-supplying of the anti-drying liquid in the third supply step S380 may be the same as or slightly faster than the time point at which the second process chamber 500 becomes available for receiving the substrate.

The substrate treating apparatus 1000 may include a controller (not shown) for controlling the substrate treating apparatus 1000. The controller (not shown) may control the first process chamber 400, the second process chamber 500, and the transfer unit 300. The controller (not shown) may control the liquid-treated substrate W to standby in the first process chamber 400 until the second process chamber 500 becomes available for receiving the substrate when the liquid-treated substrate W cannot be transferred to the second process chamber 500. The controller (not shown) may control an anti-drying liquid to be supplied to the substrate W while the liquid-treated substrate W is standing by.

Figure 6:
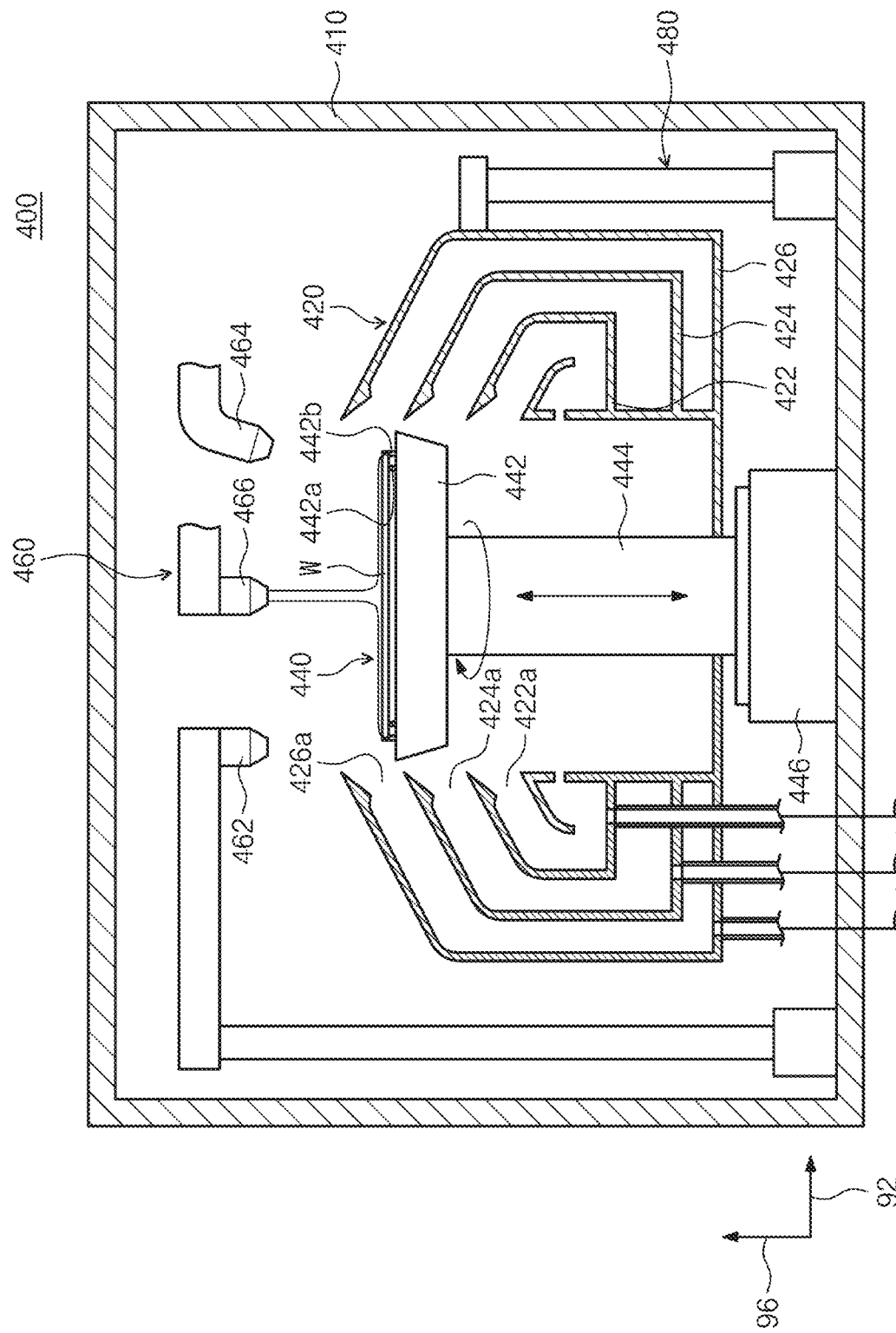
FIG. 6 to FIG. 8 are views schematically illustrating a treating of a substrate in a standby step of FIG. 4 or FIG. 5.
Figure 7:
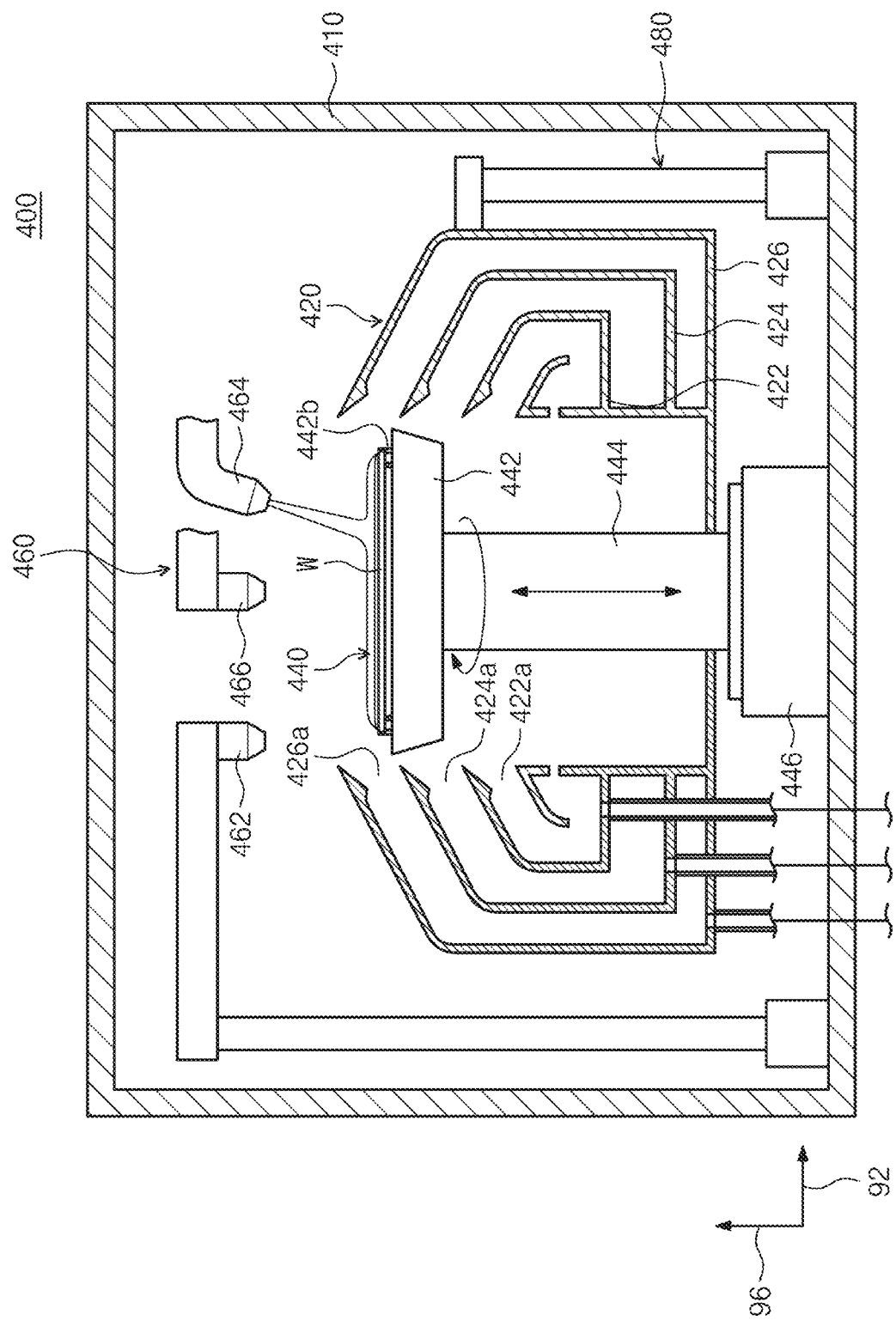
Figure 8:
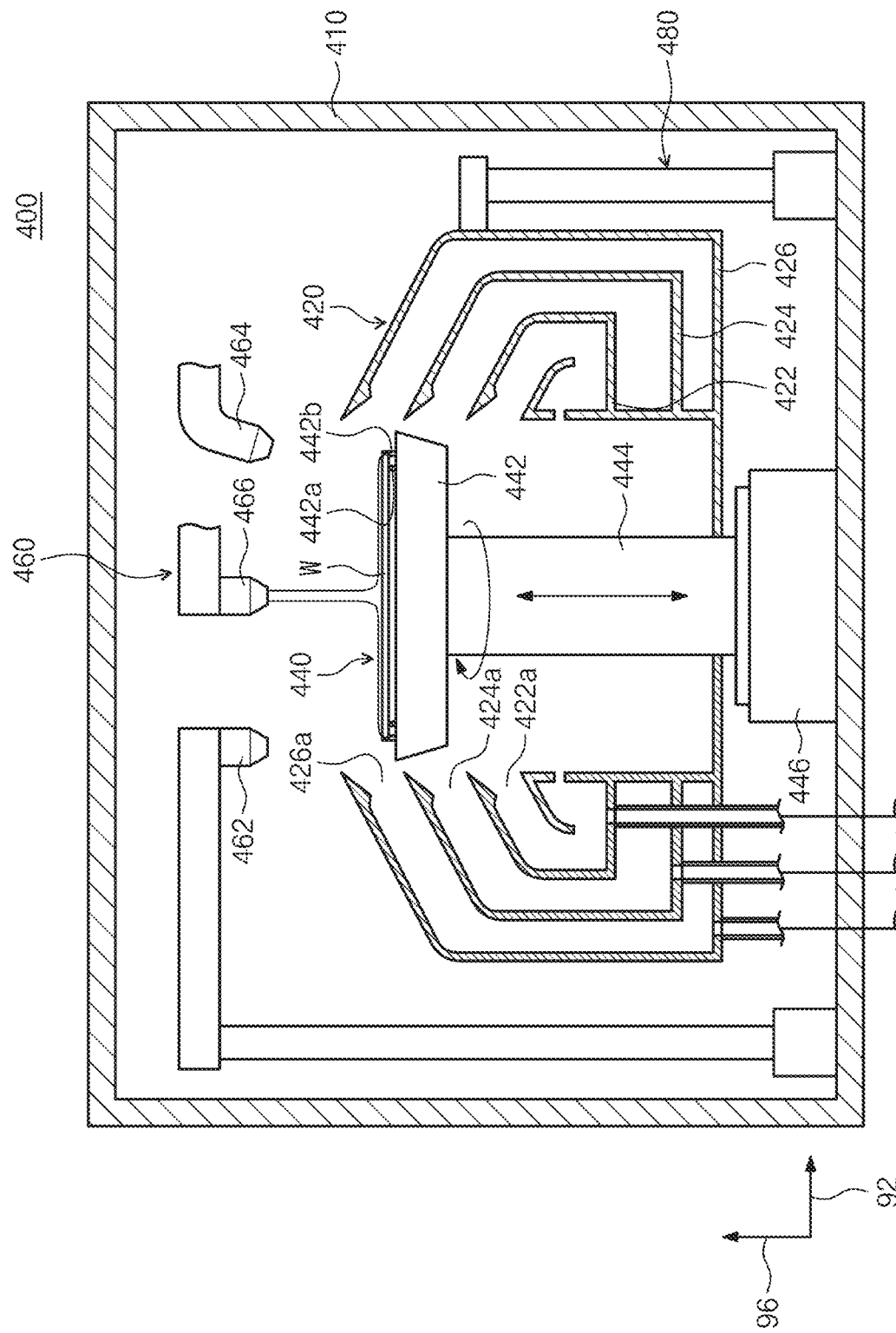

FIG. 6 to FIG. 8 are views schematically illustrating the treating of a substrate in the standby step of FIG. 4 or FIG. 5.

According to an embodiment of the inventive concept, referring to FIG. 6, a controller (not shown) may determine the state of the anti-drying liquid applied on the substrate W when the substrate W cannot be transferred to the second process chamber 500. The controller (not shown) may supply the determined anti-drying liquid to the substrate W standing by in the first process chamber 400 when it is determined that the state of the anti-drying liquid is out of an allowable range. The controller (not shown) may control the anti-drying liquid to be supplied to the substrate W standing by until the second process chamber 500 becomes available for transferring.

In the case of another embodiment of the inventive concept, referring to FIG. 6, a controller (not shown) may determine the state of the anti-drying liquid applied on the substrate W when the substrate W cannot be transferred to the second process chamber 500, and may supply the anti-drying liquid to the substrate W standing by in the first process chamber 400 when it is determined that the state of the anti-drying liquid is out of an allowable range. Referring to FIG. 7, a controller (not shown) may control the supplying of the anti-drying liquid to be stopped and control the deionized water DIW to be supplied to the substrate W at a time point after a predetermined time elapses after the anti-drying liquid is supplied. Referring to FIG. 8, the controller (not illustrated) may control the deionized water DIW to stop being supplied and control the anti-drying liquid to be resupplied to the substrate W when the second process chamber becomes available for receiving the substrate. In addition, the controller (not shown) may control the stop time of the supplying of the deionized water DIW and the re-supply time of the anti-drying liquid by predicting the time point at which second process chamber becomes available for receiving the substrate. In an embodiment, the controller (not shown) may control the second nozzle 464 so that the supplying of the deionized water DIW is stopped before the time point at which the second process chamber becomes available for receiving the substrate, and control the third nozzle 466 so that the anti-dry liquid is resupplied to the substrate W at the time point at which the supplying of the deionized water DIW is stopped. In this case, since the second process chamber 500 becomes available when the resupplying of the anti-dry liquid is stopped, the substrate W may be transferred to the second process chamber 500 at the same time as the resupplying of the anti-dry liquid is stopped. Accordingly, it is possible to shorten the overall process time and increase the throughput of the substrate per hour.

The effects of the inventive concept are not limited to the above-mentioned effects, and the unmentioned effects can be clearly understood by those skilled in the art to which the inventive concept pertains from the specification and the accompanying drawings. Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. An apparatus for treating a substrate, the substrate treating apparatus comprising:
    a liquid treating chamber configured to supply a treating liquid onto a substrate to liquid treat the substrate;
    a drying chamber configured to remove the treating liquid from the substrate;
    a transferer configured to transfer the substrate between the liquid treating chamber and the drying chamber; and
    a controller configured to control the liquid treating chamber, the drying chamber, and the transferer,
    the controller configured to control the liquid treated substrate to standby at the liquid treating chamber until the drying chamber becomes available for receiving the substrate from the liquid treating chamber, based on the liquid treated substrate at the liquid treating chamber being unable to be transferred to the drying chamber, and
    the controller configured to control the treating liquid to be supplied to the substrate while the liquid treated substrate is standing by.

2. The substrate treating apparatus of claim 1, wherein the treating liquid comprises an anti-drying liquid, and the controller is configured to determines a state of the anti-drying liquid remaining on the substrate, and based on the controller determining that the state of the anti-drying liquid is out of an allowable range, the anti-drying liquid is supplied to the substrate in standby at the liquid treating chamber.

3. The substrate treating apparatus of claim 2, wherein the controller is configured to predicts a time point at which the drying chamber becomes available for receiving the substrate from the liquid treating chamber, and the controller is configured to controls a supplying of the anti-drying liquid to be completed at the predicted time point.

4. The substrate treating apparatus of claim 2, wherein the controller is configured to controls the supplying of the anti-drying liquid to be stopped and controls a deionized water to be supplied to the substrate, based on a predetermined time elapsing from a time the anti-drying liquid starts to be supplied to the substrate while the substrate is standing by, and the controller is configured to controls a supplying of the deionized water to be stopped and controls the anti-dry liquid to be resupplied to the substrate, in response to the drying chamber becoming available for receiving the substrate.

5. The substrate treating apparatus of claim 4, wherein the controller is configured to predicts a time point at which the drying chamber becomes available for receiving the substrate, and the controller is configured to controls a stop time of the supplying of the deionized water and controls a resupply time of the anti-drying liquid, so that the supplying of the anti-dry liquid is completed at the predicted time point.

6. The substrate treating apparatus of claim 2, wherein the anti-dry liquid includes an isopropyl alcohol.

7. The substrate treating apparatus of claim 1, wherein the liquid treating chamber comprises:

a cup formed inside a treating space;

a supporter configured to support and rotate the substate in the treating space; and a liquid supplier configured to supply a treating liquid to the substrate, wherein the liquid supplier includes a first nozzle configured to supply a first liquid to the substrate, a second nozzle configured to supply a second liquid to the substrate, and a third nozzle configured to supply a third liquid to the substrate, and the treating liquid is the third liquid.

8. The substrate treating apparatus of claim 7, wherein the drying chamber comprises:

a body having an inner space formed therein;

a support configured to support the substrate in the inner space;

a fluid supplier configured to supply a supercritical fluid to the inner space; and an exhauster configured to exhaust the supercritical fluid within the inner space.

9. The substrate treating apparatus of claim 8, wherein the third liquid is more soluble in the supercritical fluid than the second liquid.

10. The substrate treating apparatus of claim 7, wherein the first liquid includes a chemical, the second liquid includes a deionized water, and the third liquid includes an anti-drying liquid.

11. A substrate treating apparatus comprising:

a liquid treating chamber configured to supply a treating liquid onto a substrate to liquid treat the substrate;

a drying chamber configured to remove the treating liquid from the substrate;

a transferer configured to transfer the substrate between the liquid treating chamber and the drying chamber; and a controller configured to control the liquid treating chamber, the drying chamber, and the transferer, the liquid treating chamber comprising:

a cup formed inside a treating space;

a supporter configured to support and rotate a substate in the treating space; and a liquid supplier configured to supply a treating liquid to the substrate, and the liquid supplier including a first nozzle configured to supply a chemical to the substrate, a second nozzle configured to supply a deionized water to the substrate, and a third nozzle configured to supply an anti-drying liquid to the substrate, the treating liquid includes the anti-drying liquid, the drying chamber comprising:

a body having an inner space formed therein;

a support configured to support the substrate in the inner space;

a fluid supplier configured to supply a supercritical fluid to the inner space; and an exhauster configured to exhaust the supercritical fluid within the inner space, and the controller configured to controls the anti-drying liquid to be supplied to the substrate until the drying chamber becomes available for receiving the substrate from the liquid treating chamber, in response to a treated substrate at the liquid treating chamber being unable to be transferred to the drying chamber.

* * * * *